United States Patent
Sai et al.

(10) Patent No.: US 6,775,310 B2
(45) Date of Patent: Aug. 10, 2004

(54) SEMICONDUCTOR LIGHT EMITTING DEVICE AND MANUFACTURING METHOD THEREOF

(75) Inventors: Hironobu Sai, Kyoto (JP); Jun Ichihara, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/152,854

(22) Filed: May 23, 2002

(65) Prior Publication Data

US 2002/0176475 A1 Nov. 28, 2002

(30) Foreign Application Priority Data

May 24, 2001 (JP) ........................................ 2001-155980

(51) Int. Cl.[7] .............................. H01S 5/00; H01L 21/00
(52) U.S. Cl. .............................. 372/45; 372/46; 372/49; 438/39; 438/41
(58) Field of Search .............................. 372/44–46, 49, 372/96; 438/39, 41

(56) References Cited

U.S. PATENT DOCUMENTS

| | | | | |
|---|---|---|---|---|
| 5,365,540 A | * | 11/1994 | Yamanaka | 372/45 |
| 5,778,018 A | * | 7/1998 | Yoshikawa et al. | 372/45 |
| 5,851,849 A | * | 12/1998 | Comizzoli et al. | 372/49 |
| 5,985,686 A | * | 11/1999 | Jayaraman | 372/45 |
| 6,201,825 B1 | * | 3/2001 | Sakurai et al. | 372/96 |
| 6,396,864 B1 | * | 5/2002 | O'Brien et al. | 372/49 |
| 6,529,541 B1 | * | 3/2003 | Ueki et al. | 372/96 |

* cited by examiner

Primary Examiner—Paul Ip
Assistant Examiner—James Menefee
(74) Attorney, Agent, or Firm—Rabin & Berdo, P.C.

(57) ABSTRACT

On a semiconductor substrate (1), a double hetero structure portion (6) in which an active layer (4) having smaller band gap is sandwiched between semiconductor layers (3, 5) having larger band gap than that of the active layer (4) is formed. A light reflection film (9) is formed at least a part of side walls of the double hetero structure portion (6). As a result, a semiconductor light emitting device that light which leaks from side wall of light emitting area in a chip is reduced and emission light can be outputted efficiently can be obtained.

19 Claims, 4 Drawing Sheets

SEMICONDUCTOR LIGHT EMITTING DEVICE AND MANUFACTURING METHOD THEREOF

FIELD OF THE INVENTION

The present invention relates to a semiconductor light emitting device which has a double hetero structure portion in which an active layer is sandwiched by semiconductor layers having a larger band gap than that of the active layer such that a light emitting layer is formed, such as a light emitting diode (LED), a laser diode (LD) having stripe groove and a vertical cavity surface emitting laser (VCSEL) which emits laser light from a surface of the laminated semiconductor layers, and a manufacturing method thereof. In particular, the present invention relates to a semiconductor light emitting device in which a radiating efficiency from side wall portions of the double hetero structure portion can be improved, light leakage can be reduced so as to enable efficient light emission in a narrow area and an efficiency of light outputted with respect to light inputted can be improved, and a manufacturing method thereof.

BACKGROUND OF THE INVENTION

A conventional surface emitting type semiconductor laser manufactured by a simple process has a structure shown by cross-sectional explanatory views in FIGS. 5A and 5B. In FIGS. 5A and 5B, a lower multi-layer reflection film 62 which is formed of a laminated structure referred to as DBR (Distributed Brag Reflector) is formaed on a semiconductor substrate 61 formed of, e.g., GaAs. On the lower multi-layer reflection film 62, a lower spacer layer 63, an active layer 64 and an upper spacer layer 65 are successively grown. On the upper spacer layer 65, an upper multi-layer reflection film 67 formed of DBR is formed. Then, as shown in FIG. 5A, an insulating area 68 is provided on an outer periphery side of a current injection area by implanting ions such as protons. Alternatively, the outer periphery side may be removed by etching as shown in FIG. 5B. Unillustrated upper and lower electrodes are respectively provided on the surface of the upper multi-layer reflection film 67 and on a rear surface of the semiconductor substrate 61 such that laser beam light can exit from a part of the upper surface.

In accordance with the above-described structure, current is injected into a narrow area serving as the current injection area, and then light with high intensity is emitted. Further, the upper and the lower multi-layer reflection films 62 and 67 resonate as a reflecting surface of cavity resonator. Thus, laser resonance occurs and a part of resonated light exits as laser beam light from a small exit opening (not shown) formed at the upper electrode through the upper multi-layer reflection film 67 which is formed so as to have a smaller reflectance than the lower multi-layer reflection film 62.

As described above, in a conventional surface emitting type semiconductor laser, optical confinement in a vertical direction is accomplished by the upper and the lower multi-layer reflection films and light emission in a horizontal direction does not occur by insulation or removal such that efficient light emission can be accomplished by injecting the current only in the light emitting area. However, since the current centralizes only in the narrow central portion and only the area emits light, an increase in temperature in the area is significant. In the structure shown in FIG. 5A, as the semiconductor layer serving as an insulating area is formed on the periphery of the light emitting area, heat capacity is relatively large. However, the semiconductor layer used for a light emitting device does not have so large heat conductivity and heat generated in the light emitting area cannot be sufficiently diffused. Thus, the semiconductor layer is easily deteriorated and a luminous efficiency is also easily decreased. Especially in the structure that the periphery of the current injection area is removed by etching as shown in FIG. 5B, heat generated at a time of light emitting cannot be diffused efficiently. For this reason, there arise problems in that the luminous efficiency is decreased and the semiconductor layer is partially damaged such that a lifetime of the laser is reduced.

The current is centralized on the narrow area to carry out efficient emission. However, in the surrounding non light emitting area, the semiconductor layer has the same composition as that of the light emitting area into which the current is injected. The non light emitting area is formed so as to have larger electric resistance due to crystal defects being generated by ion implantation. The light emitted at the current injection area easily travels toward the insulting area, so that light cannot be confined only in the current injection area. For the light which has traveled into the insulating area, according to a difference of refractive index between the insulating area and an air layer, around 30% of reflectance can be obtained at a side surface of the insulating area. At the same time, however, an amount of light leaked is significantly large. In this problem about optical confinement, even the structure shown in FIG. 5B that the outer periphery of the current injection area is removed by etching has an effect of optical confinement of around 30% with respect to total reflection on a basis of a difference of refractive index derived from direct contact with air. Accordingly, there arise problems in that a resonance efficiency cannot be sufficiently increased and thus a threshold is increased.

Such problems are not limited to the surface emitting type semiconductor laser. An LED and an LD having stripe groove have problems in that light leaks from a chip side surface of the LED or the LD (from a side surface which is perpendicular to a laser light exiting surface in a case of LD) and thus is wasted.

SUMMARY OF THE INVENTION

The present invention was devised in order to solve the above-described problems, and an object of the present invention is to provide a semiconductor light emitting device that radiating characteristic of the periphery of a light emitting area of the semiconductor light emitting device which emits light by injecting current into a part of area can be improved, an optical confinement efficiency of the periphery of the light emitting area can be improved, and thus an efficiency of light outputted with respect to a certain input can be improved, a reliability can be improved by reducing damages of semiconductor layer, and a manufacturing method thereof.

Another object of the present invention is to provide a structure for enabling improvement of heat diffusion of surface emitting type semiconductor laser in which a vertical cavity is formed by making an area of double hetero structure portion into which current is injected smaller than an area of substrate and for enabling improvement of an efficiency of light outputted, and a manufacturing method of the surface emitting type semiconductor laser.

In accordance with the present invention, a semiconductor light emitting device includes: a semiconductor substrate; and a double hetero structure portion formed on the semiconductor substrate and in which an active layer having small band gap is sandwiched between semiconductor layers having larger band gap than that of the active layer, wherein a heat radiating film which has light reflecting property and superior heat conductivity than that of the double hetero structure portion is formed at least a part of side walls of the double hetero structure portion. The side wall refers to as a surface which extends in a direction vertical to a surface of the semiconductor layers are laminated. In a case of the semiconductor element, the semiconductor layers may be laminated so as to obtain an LED, a stripe type LD or a surface emitting LD.

Because of this structure, light which is emitted from the active layer and travels toward the side walls is not emitted from the side walls and confined within the light emitting area. Further, the light contributes to oscillation within a resonator in a case of the semiconductor laser, or to emit light in a predetermined direction in a case of the LED. In both of the case of the semiconductor laser and the case of the LED, an efficiency of light outputted with respect to light inputted is improved, and heat generated due to centralization of current and light emitting can be rapidly diffused through a heat radiating film, so that troubles caused by heat generation can be prevented. Consequently, the present invention contributes significantly to light emitting efficiency and reliability.

The heat radiating film is directly applied on the periphery of a light emitting area of the double hetero structure portion. Thus, radiation can occur rapidly and the emitted light can be confined without being wasted because of the light reflecting property.

The heat radiating film is formed as a composite film made of an insulating film which is applied to the side wall of the double hetero structure portion and a metallic film which is applied to outer side of the insulating film. Since the metallic film which has superior radiation and light reflection to the insulating film can be used, an increase in temperature can be prevented efficiently by the metallic film having especially excellent heat conductivity. When a metal oxide film is used as the insulating film, a metallic film can be formed at the side walls by a plating method, and then a light reflection film which has excellent light reflection and heat diffusion can be formed by the plating method and an oxidization treatment. At least one of Cr, Ni, Cu, Pt, Ag and Al can be used for the metallic film.

When the heat radiating film is made of materials including at least one of diamond, diamond-like carbon and alumina, because these materials have excellent heat conductivity in spite of being the insulating film, heat generated in the light emitting area can be rapidly diffused while preventing short of opposite sides of the active layer of the double hetero structure portion.

A surface emitting type semiconductor laser diode of the present invention includes: a semiconductor substrate; a lower multi-layer reflection film formed on the semiconductor substrate; a double hetero structure portion which is formed on the lower multi-layer reflection film and in which an active layer with small band gap is sandwiched between semiconductor layers with larger band gap than that of the active layer, and an upper multi-layer reflection film formed on the double hetero structure portion, wherein the upper multi-layer reflection film and the double hetero structure portion on the periphery of a certain area serving as a current injection area of the double hetero structure portion are removed by etching, a heat radiating film which has light reflecting property and superior heat conductivity than that of the double hetero structure portion is formed at a side wall exposed by etching. The present invention is configured so as to be a vertical cavity type laser which emits light exits from an upper surface side of the upper multi-layer reflection film.

A method of manufacturing a semiconductor light emitting device includes the steps of: laminating semiconductor layers on a semiconductor substrate so as to form a double hetero structure portion in which an active layer with small band gap is sandwiched between semiconductor layers with larger band gap than that of the active layer; etching a part of the laminated semiconductor layers so as to expose a side wall of the double hetero structure portion; and applying a heat radiating film which has light reflecting property and superior heat conductivity than that of the double hetero structure portion to at least a part of the exposed side walls of the double hetero structure portion.

The heat radiating film may be formed such that a metallic film is formed by a plating method, and then the resultant metallic film is oxidized. Alternatively, materials for the heat radiating film may be deposited on the side walls. In a case of oxidizing the metallic film, it is preferable to additionally form a metallic film such that the radiating property can be improved.

A method of manufacturing a surface light emitting type semiconductor laser of the present invention includes the steps of: (a) growing, on a first conductive type semiconductor substrate, a lower multi-layer reflection film which is formed by laminating first conductive type semiconductor layers; (b) growing, on the lower multi-layer reflection film, a double hetero structure portion formed of a first conductive type lower spacer layer, an active layer made of semiconductor having smaller band gap than that of the spacer layer and a second conductive type upper spacer layer made of semiconductor having larger band gap than that of the active layer; (c) growing, on the double hetero structure portion, an upper multi-layer reflection film formed by laminating the second conductive type semiconductor layers; (d) removing the upper multi-layer reflection film and the double hetero structure portion on the periphery of the current injection area by etching; (e) exposing only side walls exposed by the etching and applying a metallic film on the exposed surfaces by a plating method; and (f) forming the applied metallic film into a metal oxide film by an oxidation treatment.

In the above method, instead of steps (e) to (f), an insulating film or an insulating film and a metallic film may be directly applied by a CVD method, a sputtering method, a metallic film forming method using particulates, or a vacuum evaporation method.

DETAILED DESCRIPTION

Figure 1A:
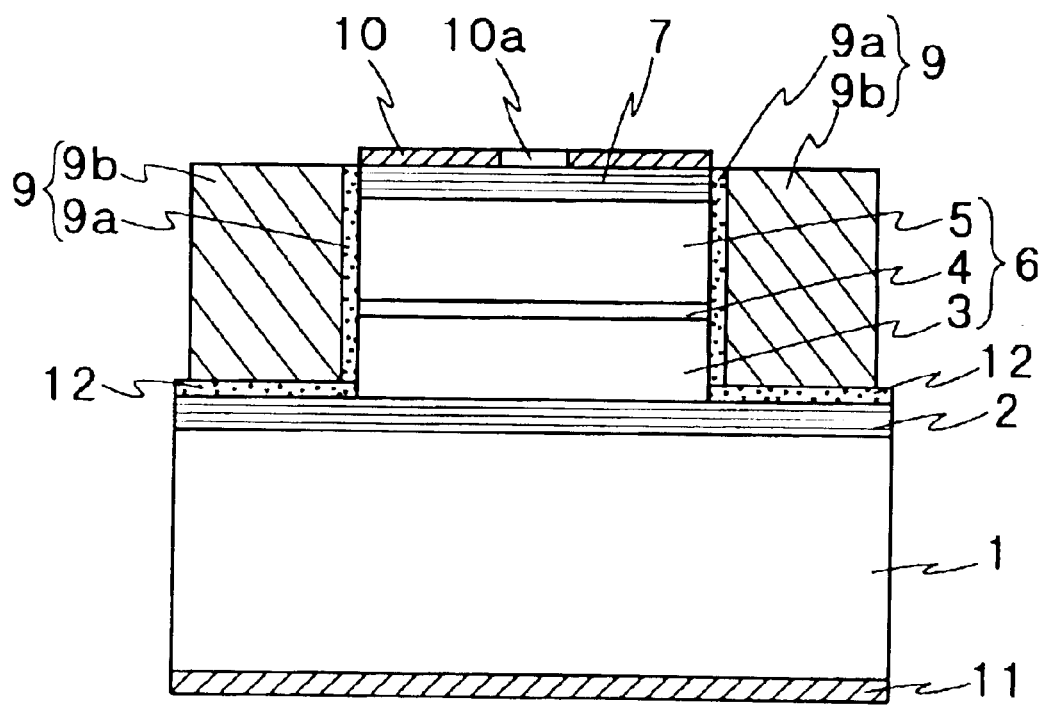
FIGS. 1A and 1B are explanatory views of an embodiment of surface emitting type semiconductor layer of the present invention.

Next, a description will be given of a semiconductor light emitting device and a manufacturing method thereof with reference to a cross-sectional explanatory view of surface emitting type semiconductor laser shown in FIG. 1A and a plan explanatory view thereof shown in FIG. 1B. The semiconductor light emitting device of the present invention includes, on a semiconductor substrate 1, a double hetero structure portion 6 in which an active layer 4 having small band gap is sandwiched between semiconductor layers 3 and 5 having larger band gap than that of the active layer 4. A heat radiating film 9 which has light reflecting property and superior heat conductivity to the double hetero structure portion is provided at at least a part of side walls of the double hetero structure portion 6.

Figure 1B:
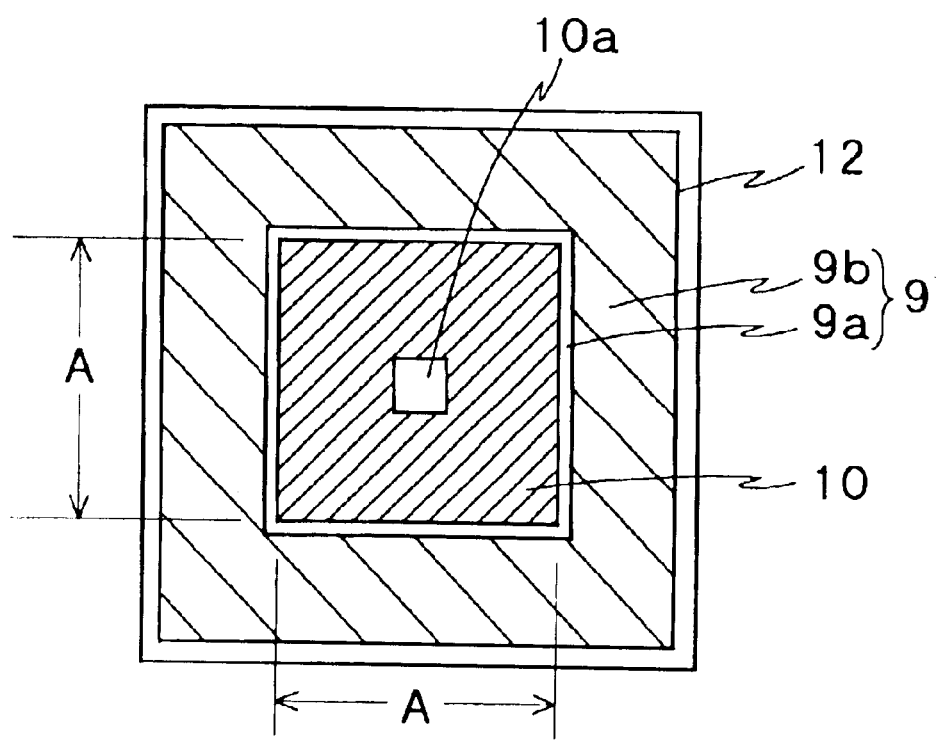

As a specific example, in a surface emitting type semiconductor laser shown in FIGS. 1A and 1B, a lower multi-layer reflection film (DBR) 2 is formed on a semiconductor substrate 1 made of e.g., n-type GaAs. On the lower multi-layer reflection film 2, the double hetero structure portion 6 that the active layer 4 having a small band gap is sandwiched between semiconductor layers 3 and 5 having larger band gap than that of the active layer 4 (i.e., spacer layers) is formed. An upper multi-layer reflection film 7 is formed on the double hetero structure portion 6. The double hetero structure portion 6 and the overlying upper multi-layer reflection film 7 on the periphery of a certain area serving as a current injection area are removed by etching. Then, a heat radiating film 9 formed of an insulating film 9a such as a metal oxide film and a metallic film 9b is formed at side walls of the area. Laser (coherent) light is emitted from an upper surface side of the upper multi-layer reflection film 7.

The metal oxide film 9a can be obtained in such a manner that a metal such as Ni or Al is made into a film by a pulse plating method and then the resultant film is oxidized. The metal oxide film 9a is used as an insulating film not so as to short between laminated semiconductor layers, and preferably have a thickness of 5 to 500 nm so as to exhibit an insulating property. If the plating method is not used, the insulating film needs not to be a metal oxide, and other insulating film having larger heat conductivity than the double hetero structure portion 6, such as diamond or diamond-like carbon (DLC) may be used. In this case, the metallic film 9b needs not to be provided and only the insulating film is formed in a direction vertical to a laminated direction with a thickness of 0.03 $\mu$m or larger. Thus, heat diffusion can occur. In a case of forming the metal oxide film 9a by oxidizing a metallic film, if the metal oxide film 9a is too thick, the metallic film is not thoroughly oxidized such that upper and lower semiconductor layers are shorted. Further, it takes a long time to perform plating, leading to an increase in costs. If the metal oxide film 9a is too thin, perfect insulation cannot be realized such that interlayer leakage may occur. When aluminum oxide is formed as the heat radiating film 9, the oxide film can perform light reflection and heat diffusion by itself.

The metallic film 9b formed on the insulating film 9a is provided to perform heat diffusion and light reflection in case the insulating film 9a cannot perform sufficient heat diffusion and light reflection by itself. Thus, a metal which can easily reflect light, has a large heat conductivity and can be easily applied by pulse plating, e.g., Cr, Ni, Cu, Pt, Ag or Al may be used as the metallic film 9b. When the metallic film 9b is formed in a direction vertical to a surface of the semiconductor layers are laminated to a thickness of, e.g., 0.03 $\mu$m or larger, the metallic film 9b can efficiently diffuse heat. At a time of forming the insulating film 9a and the metallic film 9b, an insulating mask 12 is formed so that the metallic film 9b should not to adhere to an exposed surface of the lower multi-layer reflection film 2. If the insulating mask 12 is formed of SiO$_2$, the insulating mask 12 can remain. Alternatively, a mask may be formed of a resist film or the like and is removed thereafter.

The heat radiating film 9 needs not to have a uniform thickness, and is preferably provided so as to reflect light at side surfaces and perform excellent heat diffusion. Accordingly, the method in which the metallic film is formed by the aforementioned plating method and then the resulting film is oxidized, and the metallic film is formed on the metal oxide film may not be utilized. By using a CVD method, a sputtering method, a vacuum evaporation method, a metallic film forming method using particulates or an electroless plating method, the insulating film 9a or the like can be directly formed in such a manner that surfaces other than side surfaces are masked and a wafer is inclined and rotated, or in such a manner as to be embedded into a concave portion formed at the periphery of the current injection area by etching, as a film is usually formed on a substrate. If such methods are used, diamond, DLC or alumina (Al$_x$O$_y$) having excellent reflectance and heat conductivity can be directly formed. These materials have insulating property, light reflecting property and large heat conductivity. While an AlGaAs based material for the semiconductor layer has a heat conductivity (J/(m.S.K.)) of 0.44 to 0.90, diamond, DLC and alumina have much superior heat conductivity of 6 to 21, 2 to 6 and 2 to 0.7, respectively. Subsequent to the above-described insulating film 9a being formed, the metallic film 9b can be formed by such manner. Metal has large heat conductivity and excellently diffuses heat.

Diamond or DLC can be deposited by decomposing acetylene or methane by using, e.g., a microwave plasma CVD method, a high frequency plasma CVD method, a DC plasma CVD method or a combustion method and then can be formed by a lift off method.

The lower multi-layer reflection film 2 and the upper multi-layer reflection film 7 are formed by alternately laminating layers having different refractive indexes such as GaAs (refractive index: 3.452) and AlAs (refractive index: 3.178) to a thickness of $\lambda/(4n)$ ($\lambda$ is a wavelength of light emitted from an active layer and n is a refractive index of each of the layers). Thus, the lower multi-layer reflection film 2 and the upper multi-layer reflection film 7 are formed as DBR (Distributed Brag Reflector) utilizing Brag reflection. In the multi-layer reflection films 2 and 7, if the difference of refractive index between two layers is large, a larger reflectance can be obtained by laminating smaller number of pairs of layers. If the difference of refractive index between the two layers is small, a larger reflectance can be obtained by laminating more number of pairs of layers.

In a case of the aforementioned film formed by laminating GaAs and AlAs, 90% or larger of the reflectance can be obtained by laminating 18 or more pairs of laminated layers. The lower multi-layer reflection film 2 is formed so as to have 99% or more of the reflectance with 22 pairs of the layers, so that the lower multi-layer reflection film can reflect almost light. The upper multi-layer reflection film 7 is formed so as to have about 90% or more of the reflectance with about 18 pairs of the layers, and can emit a part of reflected light. The multi-layer reflection films 2 and 7 are formed of semiconductor layers. By doping impurities, each of the semiconductor layers can have the same conductive type as that of neighborhood semiconductor layer such as an n-type or a p-type, and can be energized by electrodes on the opposite surfaces.

The double hetero structure portion 6 is formed such that the active layer 4 is sandwiched by upper and lower spacer layers 3 and 5 which are made of AlGaAs based compound semiconductors such as $Al_{0.6}Ga_{0.4}As$ having larger band gap than that of the active layer 4 and which confine carriers into the active layer 4. Materials having a band gap for enabling desired light emitting wavelength are used for the active layer 4. The active layer 4 is formed in a bulk structure or in a single- or multi-quantum well structure. For example, when the active layer 4 is formed in the multi-quantum well structure (MQW) as a semiconductor laser having stripe geometry, it is preferable because a threshold is reduced. At this time, the multi-quantum well structure (MQW) in which a well layer made of $Al_{0.2}Ga_{0.8}As$ having a thickness of around 10 nm and a barrier layer made of $Al_{0.6}Ga_{0.4}As$ having a thickness of around 8 nm are alternately laminated such that five well layers are provided is utilized.

The double hetero structure portion 6 which is sandwiched between the upper and the lower multi-layer reflection films 2 and 7 and is formed of the lower spacer layer 3, the active layer 4 and the upper spacer layer 5 is formed so as to have a total thickness which is an integer number multiple of the light emitting wavelength. In a case of a semiconductor laser which emits infrared rays having a wavelength of 780 nm, the upper and the lower spacer layers 5 and 3 with a thickness of around 80 nm are laminated. As shown in a plan explanatory view of FIG. 1B, a current injection area formed in a rectangular shape with one side A being about 30 μm is remained at a central portion of the double hetero structure portion 6. The periphery of the current injection area is removed by etching such that a mesa shape is obtained. The etching is performed by wet etching or dry etching. In a case of the wet etching, when a semiconductor layer to be etched changes, a color of the semiconductor layer changes, too. Thus, a degree of proceeding of etching can be visually confirmed. In a case of the dry etching, if the relationship between the time and an amount of etching is calculated in advance and the etching is controlled by the time, precise etching can be carried out.

The upper electrode 10 made of Ti/Au is formed on the current injection area of the upper multi-layer reflection film 7 with a laser light exiting opening 10a formed in a rectangular shape with a side of around 10 μm being formed at a central portion of the upper electrode 10. The lower electrode 11 made of Au—Ge/Au is formed at the rear surface of the semiconductor substrate 1. In this way, the resultant semiconductor laser is made into a chip. When an electrode pad for the upper electrode 10 is formed, the electrode pad cannot be formed on the upper electrode 10 with the aforementioned size. Although not illustrated, the electrode pad is formed on the upper surface of the heat radiating film 9 so as to be connected to the upper electrode 10.

In the surface emitting type semiconductor laser relating to the present invention, semiconductor layers on the periphery of the current injection area are removed by etching, and the heat radiating film having light reflecting property is formed at the side walls of the semiconductor layers that are exposed by etching. For this reason, the light which is emitted from the active layer in the current injection area can be confined within the optical resonator which is the current injection area in the vertical direction by the upper and the lower multi-layer reflection films and in the peripheral direction by the heat radiating film also serving as the light reflection film which is formed at the side walls of the current injection area. As a result, wasted light radiated from the side surfaces is reduced, which contributes to efficient resonance. Further, as heat is successfully diffused by the heat radiating film, current can be blocked and heat generated due to local light emitting can be diffused rapidly. As a result, a threshold current value can be decreased, and thus a semiconductor with significant high characteristics and high reliability can be obtained. In a case of LED, emitted light can be utilized efficiently without being wasted.

Figure 2A:
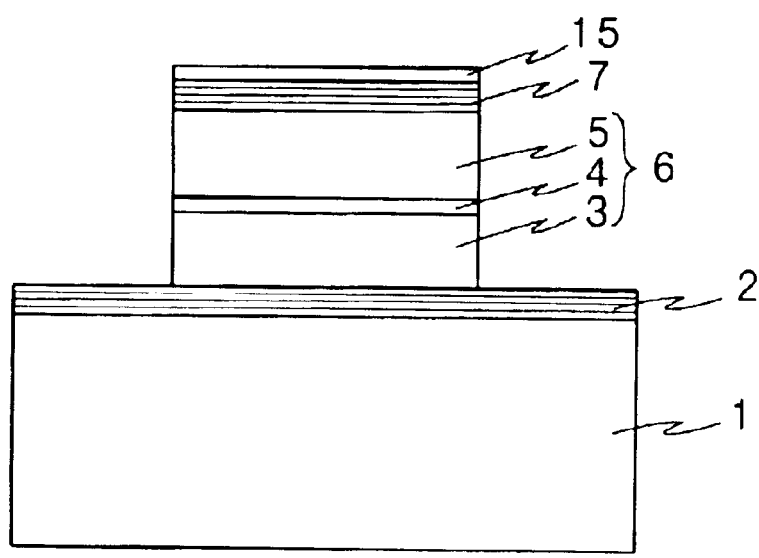
FIGS. 2A through 2C are explanatory views showing steps for manufacturing a laser chip shown in FIG. 1A.

Next, a method of manufacturing the surface emitting type semiconductor laser will be described with reference to FIG. 2. For example, an n-type GaAs substrate 1 is placed in an MOCVD (metal organic chemical vapor deposition) device. Then, required gas such as, as a reactive gas, triethylgallium (TEG), trimethylgallium (TMG), arsine $(AsH_3)$, trimethylaluminum (TMA), $H_2Se$ as an n-type dopant, dimethylzinc (DMZn) as a p-type dopant in a case of forming a p-type layer is introduced into the device respectively. As shown in FIG. 2A, 22 pairs of alternately laminated n-type GaAs and AlAs each of which has a thickness of $\lambda/(4n)$ are laminated such that lower multi-layer reflection film 2 is grown.

Next, the n-type spacer layer 3 made of, e.g., $Al_{0.6}Ga_{0.4}As$ is grown to a thickness of about 0.07 to 0.09 μm. Then, the active layer 4, which has a multi-quantum well structure (MQW) in which 3 to 5 well layers made of non-doped $Al_{0.2}Ga_{0.8}As$ and 3 to 5 barrier layers made of $Al_{0.6}Ga_{0.4}As$ are laminated, is grown to a thickness of 0.05 to 0.07 μm. Further, the p-type spacer layer 5 is grown to a thickness of 0.07 to 0.09 μm. In this way, the double hetero structure portion 6 is formed. Thereafter, 18 pairs of alternately laminated p-type GaAs and AlAs are laminated so as to form the upper multi-layer reflection film 7.

$SiO_2$ or resist film is applied on an entire surface of an area defined as the current injection area and then patterning is carried out, so that a mask 15 is formed. Then, the upper multi-layer reflection film 7 and the double hetero structure portion 6 on the periphery of the current injection area are removed by wet etching or dry etching utilizing an RIE method or an ICP method. The mask 15 is formed with one side A being about 30 μm. At this time, in a case of the wet etching, when the layers are removed, colors of the layers changes. The number of layers removed can be recognized by counting the number of layers whose colors have been changed, so that a state of etching can be visually confirmed. The lower multi-layer reflection film 2 may be also etched at this time.

Figure 2B:
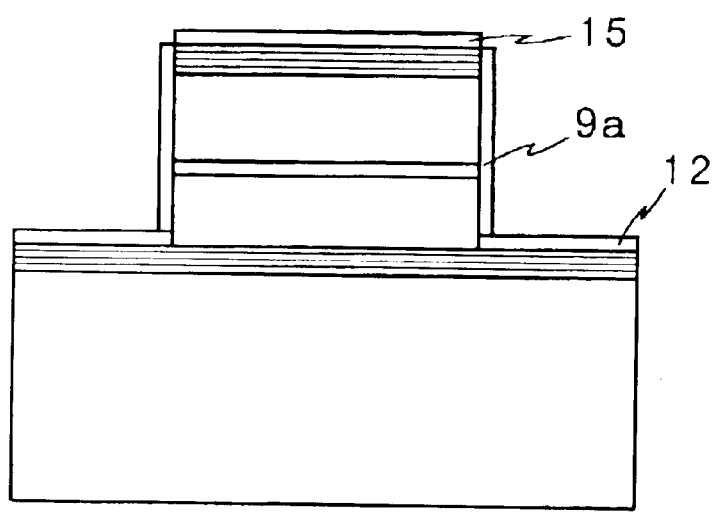

As shown in FIG. 2B, $SiO_2$ or the like is selectively applied on an exposed surface of the lower multi-layer reflection film 2 by the CVD method, so that an insulating mask 12 is formed. Then, each wafer is immersed into a plating solution. An Ni film is formed on exposed side walls of the double hetero structure portion 6 to a thickness of about 0.1 μm by a pulse plating method which applies a pulse voltage. Heat treatment is carried out at a temperature of about 400° C. for about 15 minutes under an oxidized atmosphere. The Ni film is oxidized to be an oxide thereby, and thus the insulating film 9a is formed.

Figure 2C:
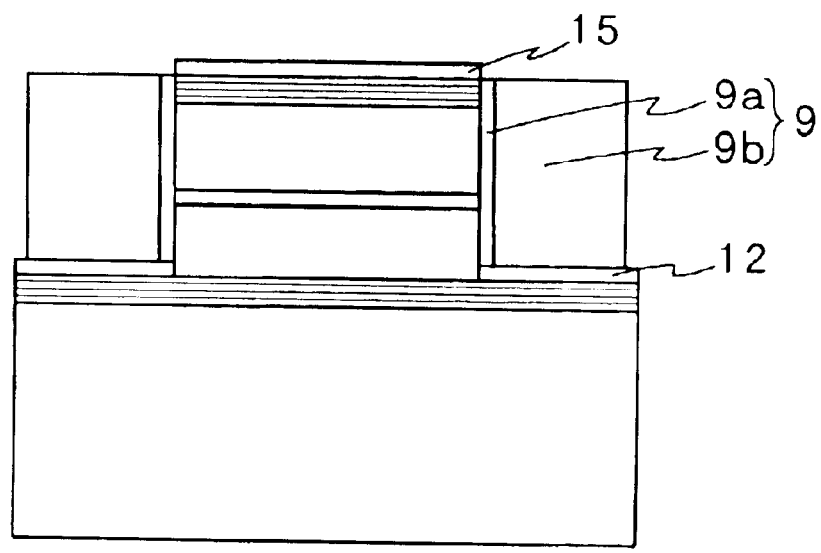

Thereafter, the wafer is immersed into a plating solution and Ni or Cu is plated by the pulse plating method. Consequently, as shown in FIG. 2C, a metallic film 9b made of Ni or Cu is formed on the insulating film 9a applied at the side walls of the double hetero structure portion 6. Then, the mask 15 on the current injection area is removed and a metal such as Ti/Au or the like is applied on the surface by deposition and patterned. Moreover, a metal such as Au—Ge/Au is applied on the rear surface of the semiconductor substrate 1 by the deposition. In this way, the upper electrode 10 and the lower electrode 11 are formed. The upper electrode 10 is patterned so as to be formed on the current injection area with the exit opening 10a formed in rectangular shape having sides of a few μm being formed at its central portion. Subsequently, the wafer is diced and made into a chip. In this way, the surface emitting type semiconductor laser shown in FIG. 1 can be obtained.

In the above-described example, a metallic film is applied by the pulse plating method on the side walls of the double hetero structure portion 6, the resultant metallic film is subjected to the oxidization treatment, and thus an insulating film can be formed. Further, a metallic film is formed on the insulating film. In addition to the plating method, these films may be formed while a wafer is inclined and rotated by a CVD method, a sputtering, a metallic film forming method utilizing particulates or a vacuum deposition method. When these films are formed by either of such methods, an uniform film thickness may not be obtained. However, as these films may function as a heat radiating film and a reflection film, a film thickness may not be necessarily uniform. By the aforementioned methods, diamond, DLC, Al, aluminum oxide ($Al_xO_y$) which is an oxide of Al that are difficult to be plated can be directly applied as a film. In addition to the MOCVD method, a semiconductor layer can be grown by other method such as an MBE method.

Figure 3:
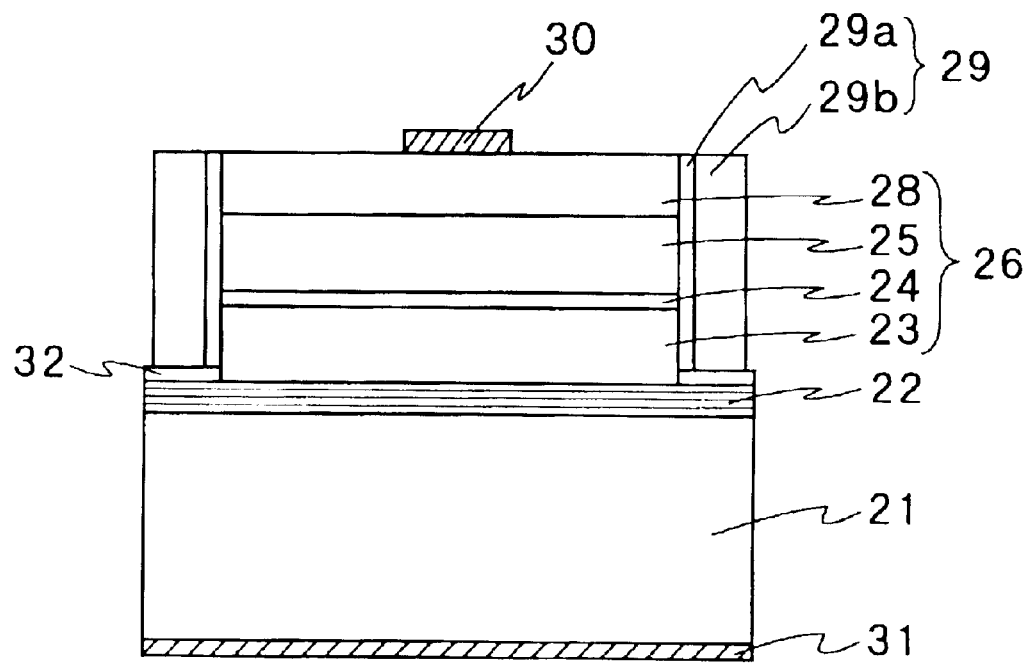
FIG. 3 is a cross-sectional explanatory view of an embodiment of an LED of the present invention.

In the above-described example, a case of the surface emitting type semiconductor layer is described. Similarly, in an LED or an LD having stripe geometry, emitted light can be efficiently utilized by preventing the light from being radiated from the side walls. FIG. 3 shows a structural example of LED. In FIG. 3, the lower multi-layer reflection film 22 which is the same as in the above-described example is formed on the semiconductor substrate 21 made of, e.g., n-type GaAs. On the lower multi-layer reflection film 22, an n-type cladding layer 23 made of, e.g., $In_{0.49}(Ga_{0.3}Al_{0.7})_{0.51}P$ is formed to a thickness of 0.3 to 1 μm. On the n-type cladding layer 23, a non-doped active layer 24 made of $In_{0.49}(Ga_{0.75}Al_{0.25})_{0.51}P$ is formed to a thickness of 0.3 to 1 μm. On the non-doped active layer 24, a p-type cladding layer 25 made of $In_{0.49}(Ga_{0.3}Al_{0.7})_{0.51}P$ is formed to a thickness of 0.3 to 1 μm. On the p-type cladding layer 25, a p-type window layer 28 made of $Al_{0.7}Ga_{0.3}As$ is formed to a thickness of 1 to 10 μm. In this way, the double hetero structure portion 26 is formed.

A groove is formed at portions of wafer at which the wafer is cut into chips (each of the chips has a side of 100 to 300 μm), and the reflection film 29 is formed at the portions similar to the above-described example. Thereafter, the substrate 21 is cut. As a result, an LED chip shown in FIG. 3 can be obtained. In this case, the groove portion preferably have a space for allowing the light reflecting film 29 to be formed. A reference numeral 32 denotes the insulating mask which is the same as in the above-described example.

In the example shown in FIG. 3, the light reflection film 29 is formed at all of four side walls of the double hetero structure portion. One or two side walls may not be provided with the light reflection film 29. The above-described multi-layer reflection film may be provided at the upper surface side, and the light may be radiated from the side walls at which the light reflection film is not provided. In this way, it is possible to prevent radiation of light from wasted side wall portions. Further, the light is not radiated from the upper surface where the light is easily blocked by the electrode pad thereon, and is radiated in a certain direction only from a part of the side walls where nothing blocks off the light. Consequently, the light can be efficiently utilized.

Figure 4:
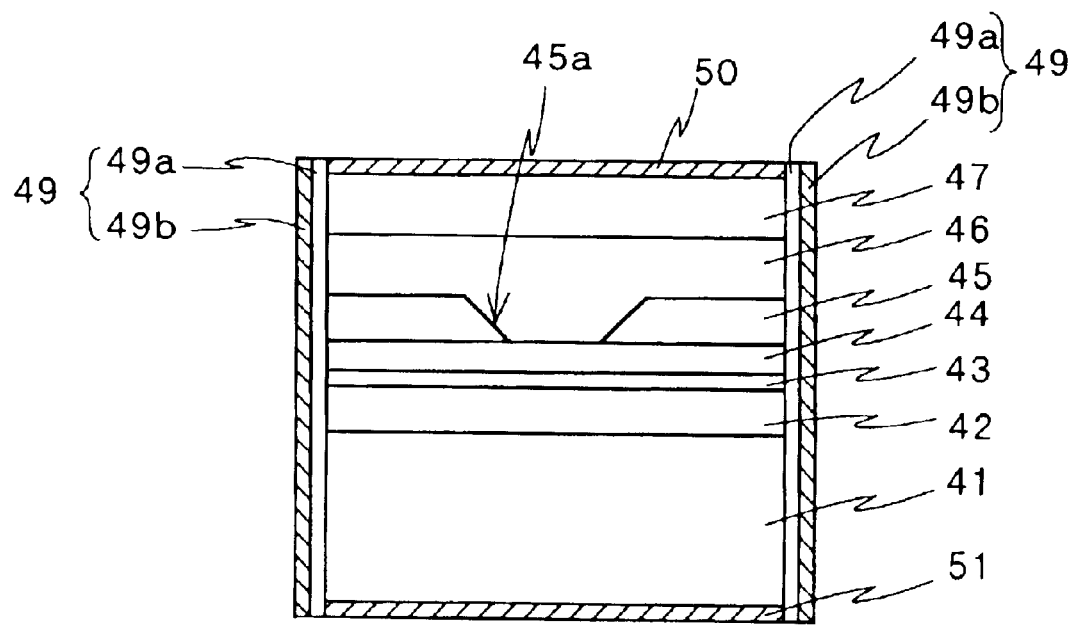
FIG. 4 is a cross-sectional explanatory view of an embodiment of an LD having stripe geometry of the present invention.
Figure 5A:
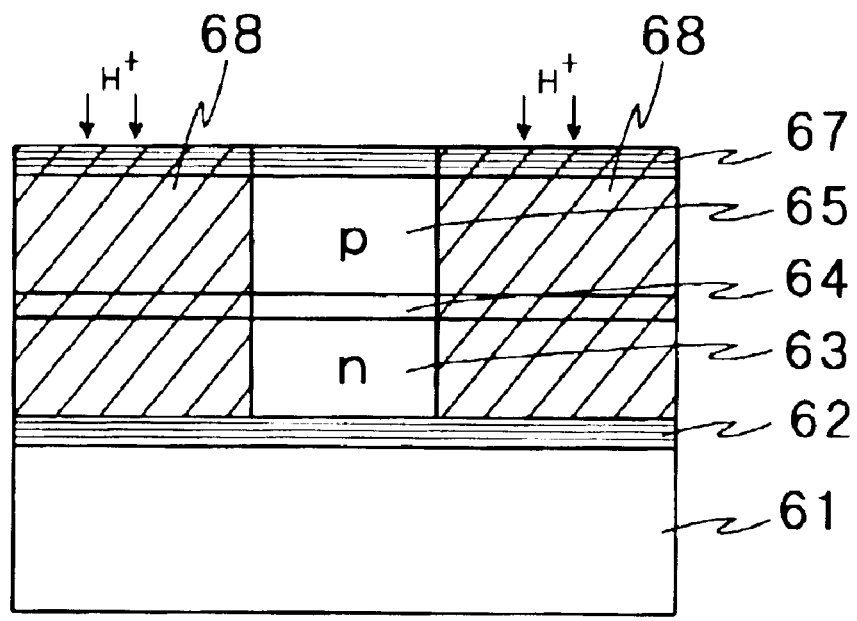
FIGS. 5A and 5B are cross-sectional explanatory views showing an example of conventional surface emitting type semiconductor laser.
Figure 5B:
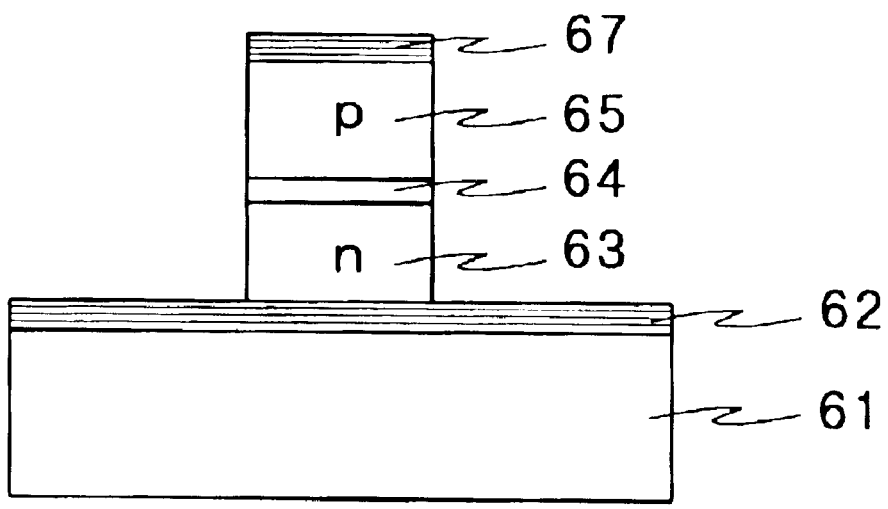

FIG. 4 is a cross-sectional explanatory view showing an example of applying the present invention to an LD having stripe geometry. Namely, for example, on an n-type GaAs substrate 41, an n-type cladding layer 42 made of, e.g., $Al_{0.6}Ga_{0.4}As$ is formed to a thickness of around 1.5 μm. On the n-type cladding layer 42, an MQW active layer 43 formed by laminating a well layer made of $Al_{0.1}Ga_{0.9}As$ and a barrier layer made of $Al_{0.3}Ga_{0.7}As$ is formed. A p-type first cladding layer 44 made of $Al_{0.6}Ga_{0.4}As$ is formed on the MQW active layer 43 to a thickness of about 0.2 μm. A current blocking layer 45 made of n-type $Al_{0.65}Ga_{0.35}As$ with a stripe groove 45a with a width of a few μm being formed is formed on the p-type first cladding layer 44. A p-type second cladding layer 46 made of $Al_{0.6}Ga_{0.4}As$ is formed on the current blocking layer 45 to a thickness of about 1.5 μm. A contact layer 47 made of p-type GaAs is formed on the p-type second cladding layer 46 to a thickness of about 1 μm. An upper electrode 50 is formed on the surface of the contact layer 47, and a lower electrode 51 is formed on the rear surface of the substrate 41.

This structure is the same as in a conventional LD having stripe geometry. In the LD of the present invention, however, a light reflection film 49 is formed at side surfaces perpendicular to a laser light exit surface (which coincides a page surface). Namely, dicing from a wafer is performed at side surfaces perpendicular to the laser light exit surface such that a bar is obtained. Then, the light exit surface is cleaved, so that the LD can be obtained. In a state of the bar before being cleaved, the light reflection film (heat radiating film) 49 (49a and 49b) is formed by the same manner as in the above-described example. Then, cleavage occurs. As a result, the LD chip with the structure shown in FIG. 4 can be obtained. Alternatively, before a wafer is cut into a bar, a groove may be formed only at a semiconductor laminated portion, and then the light reflection film 49 is formed at the groove. Subsequently, the wafer is cut into a bar and the bar is cleaved, so that a chip can be obtained.

Due to this structure, light which leaks in a horizontal direction can be confined. In the conventional structure, light is confined in a laminated direction by the cladding layer. Opposite end surfaces in a light exiting direction are made by cleavage into reflection surfaces of resonator, and the reflectance of the end surfaces is adjusted. Nevertheless, side surfaces perpendicular to the exit surface are not provided with means for sufficiently confining light. Because of this structure, the light which leaks in the horizontal direction can be reflected by the light reflection film, and can be used effectively.

In accordance with the present invention, since a heat radiating film which has light reflecting property and excellent heat conductivity is formed at side walls of a chip of a semiconductor light emitting device, light leakage from the side walls can be prevented, the light can be used effectively, and an efficiency of light outputted with respect to light inputted can be significantly improved. Further, because of excellent heat conductivity, even in a case of, e.g., a semiconductor laser whose luminous characteristic is easily affected by heat, the heat can be diffused efficiently. As a result, high quality and stable characteristic can be accomplished.

What is claimed is:

1. Semiconductor light emitting device comprising:

a semiconductor substrate;

a double hetero structure portion which is formed on said semiconductor substrate and in which an active layer having small band gap is sandwiched between semiconductor layers having larger band gap than that of the active layer; and a heat radiating film provided on at least a part of side wall of said double hetero structure portion, said heat radiating film being formed as a composite film made of an insulating film which is applied to the side wall of said double hetero structure portion and a metallic film which is applied to an outside of said insulating film, said side wall being vertical to a surface of said semiconductor layers, and said side wall having a surface different from a light emitting surface, wherein said insulating film has a high amount of reflection and a superior heat conductivity than that of said double hetero structure portion.

2. The semiconductor light emitting device according to claim 1, wherein said insulating film is formed by an oxide film of metallic film made of at least one of Al and Ni.

3. The semiconductor light emitting device according to claim 1, wherein said insulating film has a thickness of 5 to 500 nm.

4. The semiconductor light emitting device according to claim 1, wherein said metallic film is formed of at least one of Cr, Ni, Cu, Pt, Ag and Al.

5. The semiconductor light emitting device according to claim 1, wherein said semiconductor light emitting device is formed so as to constitute a light emitting diode.

6. The semiconductor light emitting device according to claim 1, wherein said semiconductor light emitting device is formed so as to constitute a stripe type laser diode.

7. The semiconductor light emitting device according to claim 1, wherein said insulating film is made of metal oxide formed by oxidizing a metal film.

8. The semiconductor light emitting device according to claim 1, wherein said metallic film is electrically independent from an electrode of the device.

9. A semiconductor light emitting device comprising:

a semiconductor substrate;

a double hetero structure portion which is formed on said semiconductor substrate and in which an active layer having small band gap is sandwiched between semiconductor layers having larger band gap than that of the active layer; and a heat radiating film provided on at least a part of side wall of said double hetero structure portion, said heat radiating film having a high amount of reflection and a superior heat conductivity than that of said double hetero structure portion, said side wall being vertical to a surface of said semiconductor layers, and said side wall having a surface different from a light emitting surface, wherein said heat radiating film is made of materials including at least one of diamond, diamond like carbon and alumina.

10. A surface emitting type semiconductor laser of a vertical cavity type, comprising:

a semiconductor substrate;

a lower multi-layer reflection film formed on said semiconductor substrate;

a double hetero structure portion which is formed on said lower multi-layer reflection film and in which an active layer with small band gap is sandwiched between semiconductor layers with larger band gap than that of said active layer;

an upper multi-layer reflection film formed on said double hetero structure portion; and a heat radiating film formed at a side wall which is formed by etching said upper multi-layer reflection film and said double hetero structure portion on the periphery of a certain area serving as a current injection area of said double hetero structure portion, said heat radiating film being formed as a composite film made of an insulating film which is applied to the side wall of said double hetero structure portion and a metallic film which is applied to an outside of said insulating film, wherein said insulating film has a high amount of reflection and a superior heat conductivity than that of said double hetero structure portion, and laser light exits from an upper surface side of said upper multi-layer reflection film.

11. The semiconductor laser according to claim 10, wherein said semiconductor substrate is made of GaAs, said double hetero structure portion is made of an AlGaAs based compound or an InGaAlP based compound, and each of said lower and upper multi-layer reflection films is formed of multi-layer film made of a GaAs layer and an AlGaAs based compound layer.

12. The semiconductor laser according to claim 10, wherein said active layer has a multi-quantum well structure.

13. A method of manufacturing a semiconductor light emitting device comprising the steps of:

laminating semiconductor layers on a semiconductor substrate so as to form a double hetero structure portion in which an active layer with small band gap is sandwiched between semiconductor layers with larger band gap than that of said active layer;

etching a part of said laminated semiconductor layers so as to expose a side wall of said double hetero structure portion; and applying a heat radiating film which has at least an insulating film to said exposed side wall of the double hetero structure portion, said insulating film having a high amount of reflection and a superior heat conductivity than that of said double hetero structure portion.

14. The method according to claim 13, wherein said insulating film is formed in such a manner that a metallic film is formed by a plating method and then, the metallic film is oxidized.

15. The method according to claim 14, wherein after said metallic film is oxidized to form a metal oxide film, a metallic film is formed on said metal oxide film.

16. The method according to claim 13, wherein said insulating film is formed in such a manner that portions other than said exposed side wall of the double hetero structure portion are masked and a material for said insulating film is applied by the side wall portion being inclined and rotated.

17. The method according to claim 13, wherein said insulating film is formed in such a manner that said material for said insulating film is embedded by deposition into a concave portion which is formed by etching laminated semiconductor layers so as to expose said side wall portion.

18. A method of manufacturing a surface light emitting type semiconductor laser, comprising the steps of:

(a) growing, on a first conductive type semiconductor substrate, a lower multi-layer reflection film which is formed by laminating first conductive type semiconductor layers;

(b) growing, on said lower multi-layer reflection film, a double hetero structure portion comprising a first conductive type lower spacer layer, an active layer made of semiconductor having smaller band gap than that of the spacer layer and a second conductive type upper spacer layer made of semiconductor having larger band gap than that of the active layer;

(c) growing, on said double hetero structure portion, an upper multi-layer reflection film formed by laminating the second conductive type semiconductor layers;

(d) removing said upper multi-layer reflection film and said double hetero structure portion on the periphery of the current injection area by etching;

(e) exposing only side wall exposed by said etching and applying a metallic film on said exposed surface by a plating method; and (f) forming a metal oxide film by oxidizing said metallic film, said metal oxide film having a high amount of reflection and a superior heat conductivity than that of said double hetero structure portion.

19. A method of manufacturing a surface emitting type semiconductor laser, comprising the steps of:

(a) growing, on a first conductive type semiconductor substrate, a lower multi-layer reflection film which is formed by laminating first conductive type semiconductor layers:

(b) growing, on said lower multi-layer reflection film, a double hetero structure portion comprising a first conductive type lower spacer layer, an active layer made of semiconductor having a smaller band gap than that of the spacer layer and a second conductive type upper spacer layer made of semiconductor having a larger band gap than that of the active layer;

(c) growing, on said double hetero structure portion, an upper multi-layer reflection film formed by laminating the second conductive type semiconductor layers;

(d) removing said upper multi-layer reflection film and said double hetero structure portion on the periphery of the current injection area by etching;

(e) exposing only side wall exposed by said etching and applying an insulating film or an insulating film and a metallic film are directly applied by a CVD method, a sputtering method, a metallic form forming method using particulates, or a vacuum deposition method, said insulating film having a high amount of reflection and a superior heat conductivity than that of said double hetero structure portion.

* * * * *